United States Patent [19]

Noguchi et al.

[11] Patent Number: 4,807,992

[45] Date of Patent: Feb. 28, 1989

[54] METHOD OF DETECTING SEMICONDUCTOR LASER MODE HOPPING AND SEMICONDUCTOR LASER BEAM SOURCE APPARATUS

[75] Inventors: Masaru Noguchi; Ichirou Miyagawa; Kazuo Horikawa, all of Kanagawa, Japan

[73] Assignee: Fuji Photo Film Co., Ltd., Kanagawa, Japan

[21] Appl. No.: 17,403

[22] Filed: Feb. 24, 1987

[30] Foreign Application Priority Data

Feb. 24, 1986 [JP] Japan .................................. 61-38608
Feb. 25, 1986 [JP] Japan .................................. 61-40058
Feb. 25, 1986 [JP] Japan .................................. 61-40059
Feb. 18, 1987 [JP] Japan .................................. 62-35227

[51] Int. Cl.$^4$ ............................................. G01J 1/42
[52] U.S. Cl. ........................................ 356/121; 250/201
[58] Field of Search ............... 356/121, 123, 375; 250/201 R; 372/32

[56] References Cited

U.S. PATENT DOCUMENTS

4,272,734  6/1981  Jarrett et al. ........................... 372/32
4,622,672  11/1986  Coldren et al. ........................ 372/97
4,625,315  11/1986  Lemberger et al. ................... 372/31
4,699,446  10/1987  Banton et al. ....................... 350/3.71
4,733,253  3/1988  Daniele ................................. 372/24
4,737,798  4/1988  Lonis et al. ............................ 372/27

Primary Examiner—F. L. Evans
Attorney, Agent, or Firm—Sughrue, Mion, Zinn, Macpeak & Seas

[57] ABSTRACT

Mode hopping of a semiconductor laser is detected by detecting at least one of movement of a laser beam emission point of the semiconductor laser in the longitudinal direction, and movement of the laser beam emission point in transverse directions. The semiconductor laser and/or a collimator lens for collimating a laser beam emitted by the semiconductor laser is moved in the longitudinal direction or in the transverse directions to cancel the movement of the laser beam emission point on the basis of a laser beam emission point signal generated by a mode hopping detecting device for detecting the movement of the laser beam emission point.

24 Claims, 3 Drawing Sheets

METHOD OF DETECTING SEMICONDUCTOR LASER MODE HOPPING AND SEMICONDUCTOR LASER BEAM SOURCE APPARATUS

BACKGROUND OF THE INVENTION

1. Field of the Invention

This invention relates to a method of detecting semiconductor laser mode hopping. This invention also relates to a semiconductor laser beam source apparatus used for laser beam scanning or the like, wherein the method of detecting semiconductor laser mode hopping is employed.

2. Description of the Prior Art

In scanning of a recording medium with a light beam conducted for recording image information or the like on the recording medium or for reading out the information recorded on the recording medium, a laser beam emitted by a semiconductor laser may be used as the scanning light beam.

Figure 6:
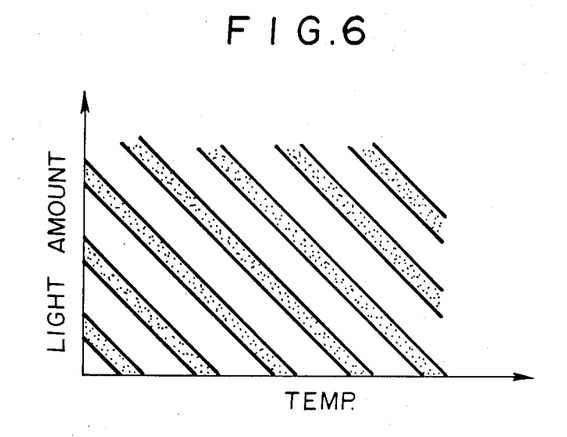
FIG. 6 is a graph showing an example of operating conditions under which mode hopping arises.

However, it is known that mode hopping arises with the semiconductor laser, depending on the operating conditions of the semiconductor laser. Specifically, in the semiconductor laser, different modes (i.e. different laser beam wavelengths) compete with each other under specific operating conditions (i.e. combinations of specific temperatures with specific light amounts), and mode hopping back and forth between one of the modes to the other is repeated under the specific operating conditions. FIG. 6 is a graph showing an example of the operating conditions under which mode hopping arises. In FIG. 6, mode hopping arises under the operating conditions corresponding to the dotted regions.

It is also known that, when mode hopping arises, the light amount of the laser beam fluctuates, and mode hopping noise arises. The magnitude of the fluctuation in the light amount of the laser beam caused by mode hopping is normally about 1%, and may increase to approximately 2% or 3% in the worst case. Therefore, in the case where laser beam scanning is conducted for processing of, for example, a continuous tone image wherein the maximum fluctuation in the light amount of the laser beam is generally required to be not larger than approximately 0.2% and mode hopping arises during the laser beam scanning, nonuniformity arises in the continuous tone image which is read out or recorded.

The inventors studied mode hopping of the semiconductor laser and found that, when mode hopping arises, both the light amount of the laser beam and the laser beam emission point (beam waist position) of the semiconductor laser change. Specifically, the laser beam emission point moves in the longitudinal direction, i.e. in the laser beam emitting direction, and in the transverse directions normal to the longitudinal direction.

Movement of the laser beam emission point has the adverse effect of causing jitter and pitch nonuniformity in light beam scanning.

As mentioned above, with the semiconductor laser, mode hopping may arise and cause undesirable changes in the condition of laser beam emission, such as changes in the light amount of the laser beam and changes in the position of the laser beam emission point.

Accordingly, in the case where light beam scanning is conducted by use of the semiconductor laser, it is desired to avoid mode hopping or to compensate for changes in the laser beam emitting condition such as changes in the light amount of the laser beam and changes in the position of the laser beam emission point. For this purpose, it is necessary to detect mode hopping arising with the semiconductor laser. By "detection of mode hopping" is meant the detection of the occurrence of mode hopping or the detection of changes in the laser beam emitting condition caused by mode hopping.

SUMMARY OF THE INVENTION

The primary object of the present invention is to provide a method of simply detecting semiconductor laser mode hopping.

Another object of the present invention is to provide a semiconductor laser beam source apparatus which eliminates adverse effects of movement of a laser beam emission point even though mode hopping arises and the laser beam emission point moves in the transverse directions or in the longitudinal direction.

The present invention provides a method of detecting semiconductor laser mode hopping, wherein mode hopping of a semiconductor laser is detected by detecting at least one of movement of a laser beam emission point of said semiconductor laser in the longitudinal direction, which is the laser beam emitting direction, and movement of said laser beam emission point in the transverse directions normal to said longitudinal direction.

The detection of movement of the laser beam emission point may be the detection of only the occurrence of movement of the laser beam emission point, or the detection of also the movement condition (i.e. movement direction, movement amount, or the like) of the laser beam emission point.

In the case of the detection of only the occurrence of movement of the laser beam emission point, the term "detection of mode hopping" means the detection of the occurrence of mode hopping. In the case of the detection of also the movement condition, the term "detection of mode hopping" means the detection of the occurrence of mode hopping and changes in the laser beam emitting condition caused by mode hopping.

The present invention also provides a semiconductor laser beam source apparatus, which comprises:

(i) a semiconductor laser, (ii) a collimator lens disposed in front of said semiconductor laser for collimating a laser beam emitted by said semiconductor laser, (iii) a mode hopping detecting device for detecting movement of the laser beam emission point of said semiconductor laser, and (iv) a movement device for moving at least one of said semiconductor laser and said collimator lens with respect to the other on the basis of a laser beam emission point signal generated by said mode hopping detecting device, thereby to eliminate fluctuations in relationship between the position of said laser beam emission point and the position of said collimator lens, which are caused by the movement of said laser beam emission point.

The mode hopping detecting device (i.e. the device for detecting the laser beam emission point) should preferably be constituted to detect both movements of the laser beam emission point in the longitudinal direction and in the transverse directions. However, the mode hopping detecting device may also be constituted to detect only the movement of the laser beam emission point in the longitudinal direction or in the transverse directions. In the latter case, the movement device must be constituted to move the semiconductor laser and/or the collimator lens at least in the longitudinal direction or in the transverse directions.

As mentioned above, in the method of detecting semiconductor laser mode hopping in accordance with the present invention, movement of the laser beam emission point of the semiconductor laser is detected. The inventors found that the laser beam emission point moves when mode hopping arises with the semiconductor laser. Therefore, when movement of the laser beam emission point of the semiconductor laser is detected in accordance with the present invention, it becomes possible to simply detect the occurrence of mode hopping.

When the movement condition is also detected in the detection of movement of the laser beam emission point, it becomes possible to obtain information on changes in the laser beam emitting condition caused by mode hopping. Specifically, when information on movement of the laser beam emission point (such movement being one of the changes in the laser beam emitting condition), and the relationship between changes in the other laser beam emitting conditions, for example, changes in the light amount of the laser beam, and the movement of the laser beam emission point are investigated, it is possible to obtain information on changes in the laser beam emitting condition from the information on movement of the laser beam emission point.

Also, when the information on the occurrence of mode hopping and the information on changes in the laser beam emitting condition caused by mode hopping are investigated, it becomes possible to take actions for eliminating adverse effects of mode hopping based on the obtained information.

The semiconductor laser beam source apparatus in accordance with the present invention is provided with the mode hopping detecting device (device for detecting the laser beam emission point) and the movement device. Therefore, when mode hopping arises and the laser beam emission point of the semiconductor laser moves, it is possible to immediately detect the movement by the mode hopping detecting device and to move the semiconductor laser and/or the collimator lens by the movement device based on the position signal generated by the mode hopping detecting device so as to prevent the relationship between the position of the laser beam emission point and the position of the collimator lens from changing. Accordingly, with the semiconductor laser beam source apparatus, it is possible to consistently obtain a laser beam free from changes in parallelism or free from deflection even though mode hopping arises and to eliminate adverse effects such as fluctuations in the size of the laser beam spot impinging upon a recording medium, jitter and pitch nonuniformity in the case of laser beam scanning.

In the case where the semiconductor laser beam source apparatus is constituted so that detection of movement of the laser beam emission point conducted by the mode hopping detecting device and movement of the semiconductor laser and/or the collimator lens conducted by the movement device are possible only in the longitudinal direction, it is possible to eliminate only changes in the relationship between the position of the laser beam emission point and the position of the collimator lens in the longitudinal direction and, as a result, to prevent at least changes in the parallelism of the laser beam. In the case where the semiconductor laser beam source apparatus is constituted so that detection of movement of the laser beam emission point conducted by the mode hopping detecting device and movement of the semiconductor laser and/or the collimator lens conducted by the movement device are possible only in the transverse directions, it is possible to eliminate only changes in the relationship between the position of the laser beam emission point and the position of the collimator lens in the transverse directions and, as a result, to prevent at least deflection of the laser beam.

DESCRIPTION OF THE PREFERRED EMBODIMENTS

The present invention will hereinbelow be described in further detail with reference to the accompanying drawings.

Figure 1:
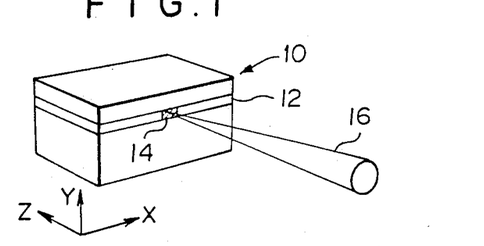
FIG. 1 is a perspective view showing a semiconductor laser.

Referring to FIG. 1, a semiconductor laser 10 emits a laser beam 16 from a laser beam emitting region, i.e. a laser beam emission point 14, of an active layer 12. The laser beam emission point 14 moves in the longitudinal direction, i.e. in the emitting direction of the laser beam 16 (Z direction), and in the transverse directions (X and Y directions) normal to the longitudinal direction due to mode hopping. The laser beam emission point 14 simultaneously moves in the longitudinal direction and in the transverse directions.

Figure 2:
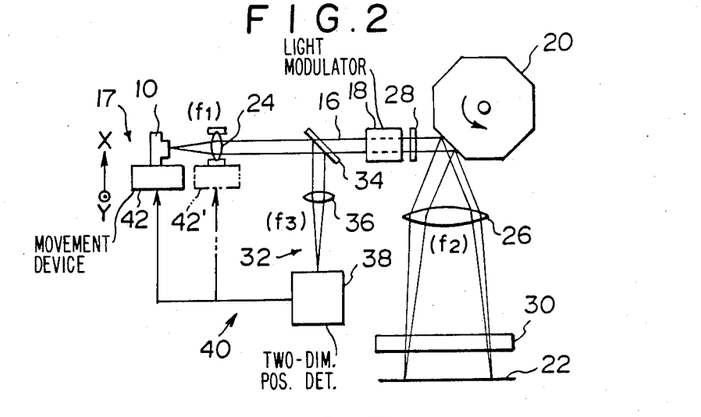
FIGS. 2 and 3 are schematic views showing light beam scanning apparatuses wherein embodiments of the semiconductor laser beam source apparatus employing the method of detecting semiconductor laser mode hopping in accordance with the present invention are employed.

FIG. 2 shows a light beam scanning recording apparatus wherein an embodiment of the semiconductor laser beam source apparatus provided with a mode hopping detecting device for carrying out an embodiment of the method of detecting semiconductor laser mode hopping in accordance with the present invention is employed. This embodiment is constituted so that detection of movement of the laser beam emission point and movement of the semiconductor laser and/or the collimator lens are possible only in the transverse directions.

In the light beam scanning recording apparatus, the laser beam 16 emitted by a semiconductor laser beam source apparatus 17 is modulated by a light modulator 18 such as an AOM, and the modulated laser beam 16 is made to scan a recording medium 22 by a rotating polygon mirror 20 acting as a light deflector. Reference numeral 26 denotes an fθ lens, and reference numerals 28 and 30 designate cylindrical lenses. The pair of cylindrical lenses 28 and 30 are used for compensation for face inclination of the rotating polygon mirror 20.

The semiconductor laser beam source apparatus 17 comprises the semiconductor laser 10, a collimator lens 24 disposed in front of the semiconductor laser 10 for collimating the laser beam 16 emitted by the semiconductor laser 10, a mode hopping detecting device 32 for detecting movement of the laser beam emission point of the semiconductor laser 10 in the transverse directions (X and Y directions), and a movement device 42 for moving the semiconductor laser 10 in the transverse directions based on a laser beam emission point signal generated by the mode hopping detecting device 32.

The mode hopping detecting device 32 is constituted by a semi-transparent mirror 34 acting as a beam splitter for splitting the laser beam 16, an image forming lens 36 for forming an image of the laser beam, which is split by the semi-transparent mirror 34, at a predetermined position, and a two-dimensional position detector 38 disposed at the image forming position. As the two-dimensional position detector 38, it is possible to use any device capable of detecting the two-dimensional position of the laser beam, for example, a continuous position detecting photodiode, a four-division photodiode, a photodiode array or a vidicon.

With the mode hopping detecting device 32, it is possible to detect the movement condition (movement amount, movement direction or the like) of the laser beam emission point of the semiconductor laser 10 in the transverse directions (X and Y directions). Information on the movement condition is sent to the movement device 42 which is combined with the mode hopping mode hopping detecting device 32 to constitute a correcting device 40.

The movement device 42 moves the semiconductor laser 10 by a small distance in the transverse directions (X and Y directions) based on the information received from the mode hopping detecting device 32 so as to cancel the movement of the laser beam emission point caused by mode hopping, i.e. to eliminate fluctuations in relationship between the position of the laser beam emission point and the position of the collimator lens, which are caused by transverse movement of the laser beam emission point. For example, when the laser beam emission point moves by $\delta$ upwardly in the X direction in FIG. 2, the movement device 42 moves the semiconductor laser 10 by $\delta$ downwardly in the X direction.

As the movement device 42, it is possible to use a device for moving the semiconductor laser 10 by a small distance in the X direction and/or in the Y direction by use of a screw, an electrostriction device, a magnetostriction device, or the like.

The inventors found that the movement amount $\delta$ of the laser beam emission point (in the X direction, in the Y direction, or in the direction resulting from combined movement in the X and Y directions) rises to as high as approximately 0.1μm, depending on the modes before and after mode hopping arises. The fluctuation amount $\Delta$ of the laser beam position caused by the movement amount $\delta$ on the scanning surface of the recording medium 22 is calculated by $$\Delta = \delta \times (f2/f1)$$

wherein f1 denotes the focal length of the collimator lens 24, and f2 designates the focal length of the fθ lens 26. Since f1 is generally within the range of 3.5 mm to 10 mm and f2 is generally within the range of 250 mm to 500 mm, $$\Delta = 2.5 \ \mu m \ to \ 15 \ \mu m.$$

When the picture element size is 80 μm, the movement amount $\Delta$ of this level corresponds to a picture element deviation, i.e. jitter or pitch nonuniformity, of 0.19 picture element.

Changes in the laser beam emission point also have adverse effects other than jitter and pitch nonuniformity. Specifically, when the laser beam emission point moves by $\delta = 1.5$ μm, the laser beam 16 is deflected after passing through the collimator lens 24 as shown in FIG. 2. When the focal length f1 of the collimator lens 24 is equal to 1 mm, the angle of the laser beam 16 incident upon the AOM 18 is deviated by approximately 5.2''. As a result, the diffraction condition slightly deviates from the Bragg condition, and the diffraction efficiency of the AOM 18 decreases.

The mode hopping detecting device 32 should preferably be adjusted so that the movement amount of the laser beam image forming position on the two-dimensional position detector 38 becomes not smaller than approximately 10 times the movement amount of the laser beam emission point on the semiconductor laser 10. For this purpose, for example, the condition $f3/f1 \gtrsim 10$ where f3 denotes the focal length of the image forming lens 36. Since the resolution of the two-dimensional position detector 38 is within the range of approximately 0.1 μm to 0.2 μm, it would become impossible to correctly detect the movement amount of the laser beam emission point unless said movement amount is enlarged to approximately 10 times.

In the aforesaid embodiment, it is only necessary that the movement device 42 be capable of moving at least one of the semiconductor laser 10 and the collimator lens 24 with respect to the other in the transverse directions. Thus the movement device 42 need not necessarily be constituted to move the semiconductor laser 10, and may be constituted as a movement device 42' as indicated by the chain line in FIG. 2 for moving the collimator lens 24 in the transverse directions, or may be of the type moving both the semiconductor laser 10 and the collimator lens 24 in the transverse directions.

The movement of the collimator lens 24 alone or the movements of both the semiconductor laser 10 and the collimator lens 24 are conducted to eliminate fluctuations in relationship between the position of the laser beam emission point and the position of the collimator lens 24 as in the case of aforesaid movement of the semiconductor laser 10 alone. For example, in the case where the collimator lens 24 alone is to be moved and the laser beam emission point moves by $\delta$ upwardly in the X direction in FIG. 2 in the semiconductor laser 10, the collimator lens 24 is moved by the same distance, i.e. by $\delta$, in the same direction, i.e. upwardly in the X direction.

In the case where the collimator lens 24 is moved as the laser beam emission point moves, the optical axis of the laser beam 16 is shifted in parallel by a distance equal to the movement distance of the laser beam emission point though it is possible to prevent deflection of the laser beam 16 after passage through the collimator lens 24 unlike the case where the semiconductor laser 10 is moved. However, the distance of the parallel shifting of the optical axis is very small and, for example, is about 0.1 μm at the most for a picture element size of 80 μm. Therefore, when deflection of the laser beam 16 does not arise even though parallel shifting of the optical axis of the laser beam 16 arises, it is possible to substantially eliminate adverse effects such as jitter and pitch nonuniformity.

With the aforesaid embodiment, when mode hopping arises and the laser beam emission point of the semiconductor laser 10 moves in the transverse directions, it is possible to immediately detect the movement by the mode hopping detecting device 32, to feed the information on the movement of the laser beam emission point from the detecting device 32 to the movement device 42, and to move the semiconductor laser 10 and/or the collimator lens 24 by the movement device 42 based on said information so as to cancel the movement of the laser beam emission point. As a result, no deflection of the laser beam 16 after passage through the collimator lens 24 does not arise even though mode hopping arises, and it becomes possible to eliminate jitter, pitch nonuniformity or the like.

Figure 3:
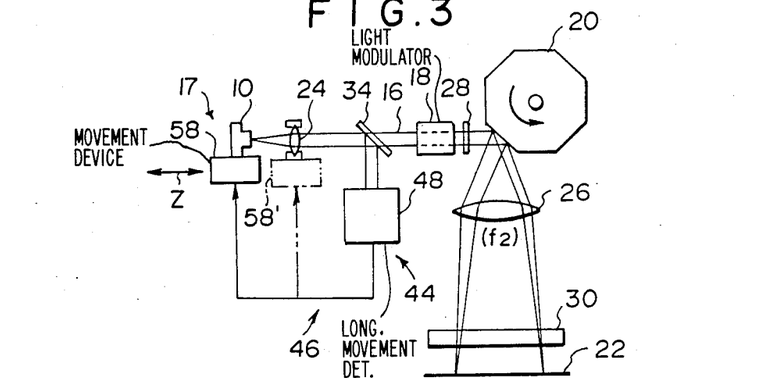

FIG. 3 shows a light beam scanning recording apparatus wherein another embodiment of the semiconductor laser beam source apparatus provided with a mode hopping detecting device 44 for carrying out another embodiment of the method of detecting semiconductor laser mode hopping in accordance with the present invention is employed. In FIG. 3, similar elements are numbered with the same reference numerals with respect to FIG. 2. The light beam scanning recording apparatus shown in FIG. 3 is similar to that shown in FIG. 2, except for a correcting device 46 including a mode hopping detecting device 44. This embodiment is constituted so that detection of movement of the laser beam emission point and movement of the semiconductor laser and/or the collimator lens are possible only in the longitudinal direction.

The semiconductor laser beam source apparatus 17 comprises the semiconductor laser 10, the collimator lens 24 disposed in front of the semiconductor laser 10 for collimating the laser beam 16 emitted by the semiconductor laser 10, a mode hopping detecting device 44 for detecting movement of the laser beam emission point of the semiconductor laser 10 in the longitudinal direction (Z direction), and a movement device 58 for moving the semiconductor laser 10 in the longitudinal direction based on a laser beam emission point signal generated by the mode hopping detecting device 44.

The mode hopping detecting device 44 carries out the method of detecting the movement condition of the laser beam emission point of the semiconductor laser 10 in the longitudinal direction (Z direction). The mode hopping detecting device 44 is constituted by the semi-transparent mirror 34, and a longitudinal movement detector 48 for receiving the laser beam split by the semi-transparent mirror 34 and detecting the longitudinal movement condition of the laser beam emission point.

Figure 4A:
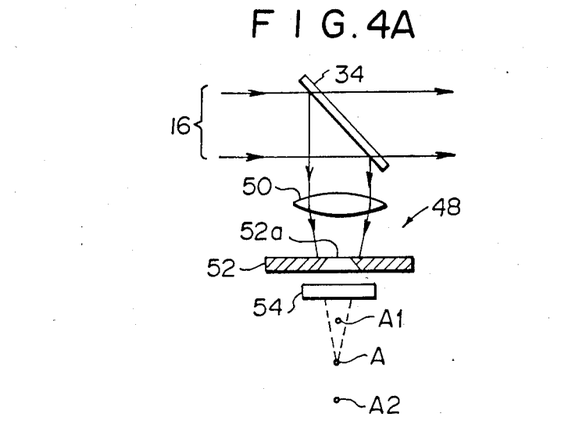
FIGS. 4A, 4B and 4C are schematic views showing examples of the longitudinal movement detecting device in FIG. 3.
Figure 4B:
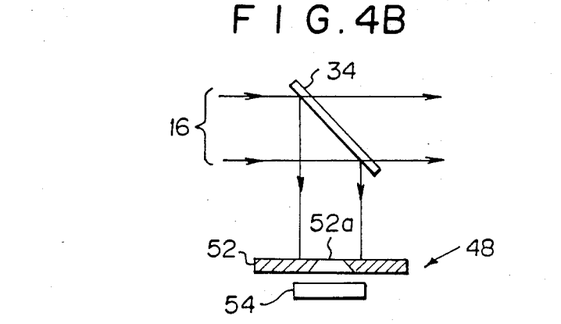
Figure 4C:
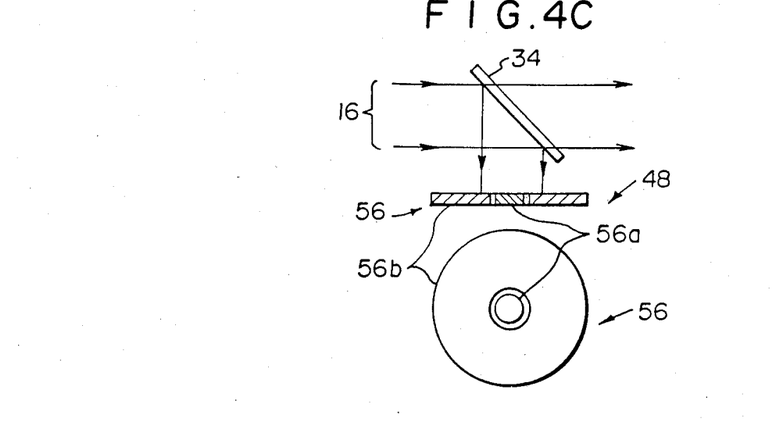

FIGS. 4A, 4B and 4C show examples of the longitudinal movement detector 48, which utilize changes in the parallelism of the laser beam 16 arising after passage through the collimator lens 24 when the laser beam emission point moves in the longitudinal direction.

The longitudinal movement detector 48 shown in FIG. 4A comprises a converging lens 50 for converging the laser beam split by the semi-transparent mirror 34, an opening member 52 provided with an opening 52a for allowing a part of the laser beam passing through the converging lens 50 to pass therethrough, and a photodetector 54 for detecting the light amount of the laser beam passing through the opening 52a.

As mentioned above, when the laser beam emission point moves in the longitudinal direction, the parallelism of the laser beam after passing through the collimator lens 24 changes. For example, when the laser beam emission point moves leftwardly in FIG. 3, the laser beam 16 after passing through the collimator lens 24 is slightly converged, and therefore the split laser beam passing through the converging lens 50 is converged to a point A1 above a correct converging point A. In this case, the light amount of the laser beam passing through the opening 52a increases. On the other hand, in the case where the laser beam emission point moved rightwardly in FIG. 3, the split laser beam is converted to a point A2 below the correct converging point A and, as a result, the light amount of the laser beam passing through the opening 52a decreases. Therefore, it is possible to detect the movement of the laser beam emission point in the longitudinal direction on the basis of the changes in the light amount of the laser beam detected by the photodetector 54.

The longitudinal movement detector 48 shown in FIG. 4B is similar to that shown in FIG. 4A, except that the converging lens 50 is omitted. Also in this case, the light amount of the split laser beam passing through the opening 52a is detected by the photodetector 54, and the movement of the laser beam emission point in the longitudinal direction is detected based on changes in the detected light amount. In this case, since no converging lens 50 is present, the ratio of the change in the detected light amount to the change in the laser beam emission point becomes smaller than in the device of FIG. 4A.

The longitudinal movement detector 48 shown in FIG. 4C is provided with a two-division circular photodetector 56 comprising a center section 56a and an outer circumferential section 56b spaced at a predetermined distance from the center section 56a. In this case, when the laser beam emission point moves in the longitudinal direction and the parallelism of the laser beam 16 changes, the ratio of the light amount received by the center section 56a to the light amount received by the outer circumferential section 56b changes. The movement of the laser beam emission point in the longitudinal direction is detected based on the change in said ratio.

The directions of changes, i.e. the increase and decrease, in the received light amount in the examples of FIGS. 4A and 4B, and the direction of change in the ratio of received light amounts in the example of FIG. 4C correspond to the directions of the longitudinal movement of the laser beam emission point, i.e. the rightward and leftward movements in FIG. 3. Also, the extent of change in the received light amount and the extent of change in the received light amount ratio correspond to the amounts of movement of the laser beam emission point. Therefore, it is possible to detect the movement direction and movement amount of the laser beam emission point based on the change directions and change extents of the received light amount and the received light amount ratio.

Since the light amount of the laser beam changes by approximately several percent due to mode hopping, the longitudinal movement detector 48 should be adjusted so that the extent of change in the light amount of the laser beam caused by the longitudinal movement of the laser beam emission point exceeds the change width of approximately several percent. For this purpose, for example, in the case of FIG. 4A, the ratio of the focal length of the collimator lens 24 to the focal length of the converging lens 50 may be adjusted to an appropriate value. In the case of FIG. 4C, said adjustment of the focal length ratio is unnecessary.

In FIG. 3, the correcting device 46 is constituted by the mode hopping detecting device 44 and a movement device 58. The output of the mode hopping detecting device 44 is sent to the movement device 58. The movement device 58 moves the semiconductor laser 10 by a small distance in the longitudinal direction (Z direction), for example by thread feed, based on the output (information on movement of the laser beam emission point in the longitudinal direction) received from the mode hopping detecting device 44 so as to cancel the longitudinal movement of the laser beam emission point caused by mode hopping, i.e. to eliminate fluctuations in relationship between the position of the laser beam emission point and the position of the collimator lens, which are caused by longitudinal movement of the laser beam emission point. For example, when the laser beam emission point moves by δ rightwardly in the Z direction in FIG. 3, the movement device 58 is operated to move the semiconductor laser 10 by δ leftwardly.

In the embodiment of FIG. 3, it is only necessary that the movement device 58 be capable of moving at least one of the semiconductor laser 10 and the collimator lens 24 with respect to the other in the longitudinal direction. Thus the movement device 58 need not necessarily be constituted to move the semiconductor laser 10, and may be constituted as a movement device 58' as indicated by the chain line in FIG. 3 for moving the collimator lens 24 in the longitudinal direction, or may be of the type moving both the semiconductor laser 10 and the collimator lens 24 in the longitudinal direction.

The movement of the collimator lens 24 alone or the movements of both the semiconductor laser 10 and the collimator lens 24 are conducted to eliminate fluctuations in relationship between the position of the laser beam emission point and the position of the collimator lens 24 as in the case of aforesaid movement of the semiconductor laser 10 alone. For example, in the case where the collimator lens 24 alone is to be moved and the laser beam emission point moves by δ rightwardly in the Z direction in FIG. 3 in the semiconductor laser 10, the collimator lens 24 is moved by the same distance, i.e. by δ, in the same direction, i.e. rightwardly in the Z direction.

With the embodiment of FIG. 3, when the laser beam emission point of the semiconductor laser 10 moves in the longitudinal direction due to mode hopping, the movement is immediately detected by the mode hopping detecting device 44. The information on the movement of the laser beam emission point is sent from the mode hopping detecting device 44 to the movement device 58. Based on the information, the semiconductor laser 10 and/or the collimator lens 24 is moved by the movement device 58 in a direction for cancelling the movement of the laser beam emission point. Accordingly, the converging position of the laser beam 16 does not fluctuate even though mode hopping arises, and it becomes possible to eliminate fluctuations in the size of the laser beam spot impinging upon the recording medium 22, or the like.

In the method of detecting semiconductor laser mode hopping in accordance with the present invention, movement of the laser beam emission point in the transverse directions and in the longitudinal direction may also be detected simultaneously. Such an embodiment may be carried out by the provision of the mode hopping detecting devices 32 and 44 shown in FIGS. 2 and 3. The embodiment wherein the movement of the laser beam emission point in the transverse directions and in the longitudinal direction are detected simultaneously may be used, for example, for moving the semiconductor laser 0 in the transverse directions and in the longitudinal direction based on the information on the movement of the laser beam emission point in the transverse and longitudinal directions detected by said embodiment so as to cancel the movement in these directions.

Figure 5:
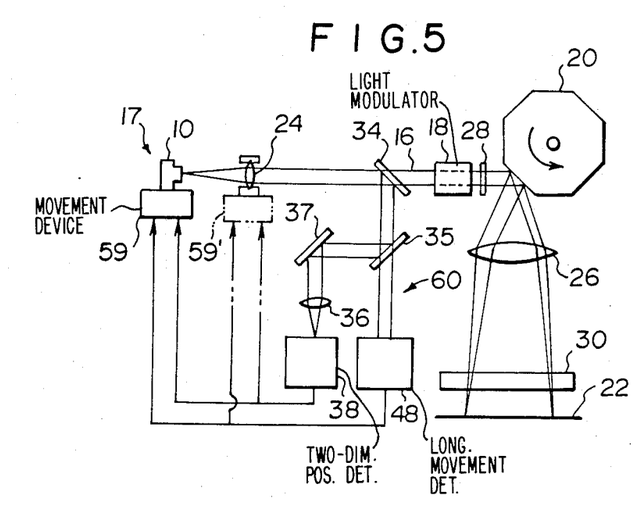
FIG. 5 is a schematic view showing a light beam scanning apparatus wherein a further embodiment of the semiconductor laser beam source apparatus employing the method of detecting semiconductor laser mode hopping in accordance with the present invention is employed.

FIG. 5 shows a light beam scanning recording apparatus wherein a further embodiment of the semiconductor laser beam source apparatus provided with a mode hopping detecting device 59 for carrying out a further embodiment of the method of detecting semiconductor laser mode hopping in accordance with the present invention is employed. In this embodiment, detection of movement of the laser beam emission point and movement of the semiconductor laser and/or the collimator lens are conducted both in the transverse directions and in the longitudinal direction. In FIG. 5, similar elements are numbered with the same reference numerals with respect to FIG. 2.

In the embodiment of FIG. 5, the semiconductor laser beam source apparatus 17 comprises the semiconductor laser 10, the collimator lens 24 disposed in front of the semiconductor laser 10 for collimating the laser beam 16 emitted by the semiconductor laser 10, a mode hopping detecting device 60 for detecting movement of the laser beam emission point of the semiconductor laser 10 in the transverse directions and in the longitudinal direction, and a movement device 59 for moving the semiconductor laser 10 in the transverse directions and in the longitudinal direction based on a laser beam emission point signal generated by the mode hopping detecting device 60.

The mode hopping detecting device 60 is constituted by the semi-transparent mirror 34, the image forming lens 36 and the two-dimensional position detector 38 which are of the same types as in the apparatus as shown in FIG. 2, and which are combined with the longitudinal movement detector 48 of the same type as in the apparatus of FIG. 3 via a semitransparent mirror 35 and a mirror 37 as shown.

The movement device 59 is constituted for transverse and longitudinal movements by combining the device for transverse movement as shown in FIG. 2 with the device for longitudinal movement as shown in FIG. 3.

As in the cases of the aforesaid embodiments, the movement device 59 may also be constituted as a movement device 59' as indicated by the chain line for moving the collimator lens 24, or may be constituted for moving both the semiconductor laser 10 and the collimator lens 24.

As mentioned above, the method of detecting semiconductor laser mode hopping in accordance with the present invention is based on the findings that the laser beam emission point moves in the transverse directions and in the longitudinal direction when mode hopping arises. Mode hopping of the semiconductor laser is detected by detecting the movement of the laser beam emission point.

The detection of movement of the laser beam emission point is not limited to the case where the movement condition of the laser beam emission point is also detected. Thus only the movement of the laser beam emission point may merely be detected. In this case, detection of mode hopping means detection of the occurrence of mode hopping. The method of the present invention in this case is usable typically for avoiding mode hopping caused by changing the operating conditions of the semiconductor laser, and for various other purposes.

In the case where the detection of the movement of the laser beam emission point also includes the detection of the movement condition of the laser beam emission point, detection of mode hopping means detection of changes in the laser beam emitting condition caused by mode hopping. The method of the present invention in this case is also usable for various purposes. A typical purpose is to move the semiconductor laser so as to cancel the movement of the laser beam emission point by directly utilizing the information on the movement condition of the laser beam emission point. Further, the method of the present invention may be used for cancelling the movement of the laser beam emission point by moving, for example, the recording medium. Or, the relationship between the movement of the laser beam emission point and changes in the laser beam emitting condition other than the movement of the laser beam emission point, for example, a change in the light amount of the laser beam, may be investigated in advance, and the method of the present invention may be used for cancelling the changes in the laser beam emitting conditions. Specifically, for example, the operating conditions of the semiconductor laser may be changed to change the light amount of the laser beam for cancelling the change in the light amount of the laser beam, or a read-out signal may be corrected when the information recorded on the recording medium is read out.

The present invention is applicable not only to the light beam scanning recording apparatus but also to a light beam scanning read-out apparatus and applications other than the light beam scanning.

We claim:

1. A method of detecting semiconductor laser mode hopping, wherein mode hopping of a semiconductor laser is detected by detecting at least one of movement of a laser beam emission point of said semiconductor laser in a longitudinal direction, which is a laser beam emitting direction, and movement of said laser beam emission point in a transverse directions normal to said longitudinal direction.

2. A method as defined in claim 1 wherein said movement of said laser beam emission point in the transverse directions is detected by splitting the laser beam emitted by said semiconductor laser by use of a beam splitter, forming an image of the split laser beam by an image forming lens, and detecting an image forming position of said split laser beam on a two-dimensional position detector, said beam splitter and said image forming lens together constituting an optical system.

3. A method as defined in claim 2 wherein the optical system for detecting said movement is adjusted so that a movement amount of said image forming position on said two-dimensional position detector becomes not smaller than approximately 10 times the movement amount of said laser beam emission point on said semiconductor laser.

4. A method as defined in claim 1 wherein said movement of said laser beam emission point in the longitudinal direction is detected by collimating the laser beam emitted by said semiconductor laser, splitting the collimated laser beam, converging the split laser beam by a converging lens so that the split laser beam partially passes through an opening, and detecting the light amount of the split laser beam passing through said opening.

5. A method as defined in claim 1 wherein said movement of said laser beam emission point in the longitudinal direction is detected by collimating the laser beam emitted by said semiconductor laser, splitting the collimated laser beam so that the split laser beam partially passes through an opening, and detecting the light amount of the split laser beam passing through said opening.

6. A method as defined in claim 1 wherein said movement of said laser beam emission point in the longitudinal direction is detected by collimating the laser beam emitted by said semiconductor laser, splitting the collimated laser beam so that the split laser beam impinges upon a two-division circular photodetector comprising a center section and an outer circumferential section in spaced relation to said center section, and detecting a change in the ratio of the light amount of the split laser beam received by said center section to the light amount of the split laser beam received by said outer circumferential section.

7. A semiconductor laser beam source apparatus, which comprises:
(i) a semiconductor laser,
(ii) a collimator lens disposed in front of said semiconductor laser for collimating a laser beam emitted by said semiconductor laser,
(iii) a mode hopping detecting device for detecting movement of the laser beam emission point of said semiconductor laser, and
(iv) a movement device for moving at least one of said semiconductor laser and said collimator lens with respect to the other on the basis of a laser beam emission point signal generated by said mode hopping detecting device, thereby to eliminate fluctuations in relationship between the position of said laser beam emission point and the position of said collimator lens, which are caused by the movement of said laser beam emission point.

8. An apparatus as defined in claim 7 wherein said mode hopping detecting device detects movement of said laser beam emission point of said semiconductor laser in a longitudinal direction which is a laser beam emitting direction, and said movement device moves at least one of said semiconductor laser and said collimator lens with respect to the other in said longitudinal direction.

9. An apparatus as defined in claim 7 wherein said mode hopping detecting device detects movement of said laser beam emission point of said semiconductor laser in transverse directions normal to said laser beam emitting direction, and said movement device moves at least one of said semiconductor laser and said collimator lens with respect to the other in said transverse directions.

10. An apparatus as defined in claim 7 wherein said mode hopping detecting device detects movement of said laser beam emission point o said semiconductor laser in a longitudinal direction which is a laser beam emitting direction and movement of said laser beam emission point of said semiconductor laser in transverse directions normal to said laser beam emitting direction, and said movement device moves at least one of said semiconductor laser and said collimator lens with respect to the other in said longitudinal direction and in said transverse directions.

11. An apparatus as defined in claim 7 wherein said movement device moves said semiconductor laser.

12. An apparatus as defined in claim 7 wherein said movement device moves said collimator lens.

13. An apparatus as defined in claim 7 wherein said movement device moves both said semiconductor laser and said collimator lens.

14. An apparatus as defined in claim 8 wherein said mode hopping detecting device comprises a beam splitter for splitting the collimated laser beam, and a longitudinal movement detector for receiving the laser beam split by said beam splitter and detecting the movement of said laser beam emission point of said semiconductor laser in the longitudinal direction.

15. An apparatus as defined in claim 14 wherein said longitudinal movement detector comprises a converging lens for converging the split laser beam, an opening member provided with an opening for allowing a part of the split laser beam passing through said converging lens, and a photodetector for detecting the light amount of the split laser beam passing through said opening.

16. An apparatus as defined in claim 14 wherein said longitudinal movement detector comprises an opening member provided with an opening for allowing a part of the laser beam split by said beam splitter to pass therethrough, and a photodetector for detecting the light amount of the split laser beam passing through said opening.

17. An apparatus as defined in claim 14 wherein said longitudinal movement detector comprises a two-division circular photodetector constituted by a center section and an outer circumferential section in spaced relation to said center section and disposed so that the laser beam split by said beam splitter impinges thereupon.

18. An apparatus as defined in claim 9 wherein said mode hopping detecting device comprises a beam splitter for splitting the laser beam emitted by said semiconductor laser, an image forming lens for forming an image of the split laser beam at a predetermined position, and a two-dimensional position detector positioned at said image forming position.

19. An apparatus as defined in claim 18 wherein said mode hopping detecting device is adjusted so that a movement amount of said image forming position on said two-dimensional position detector becomes not smaller than approximately 10 times the movement amount of said laser beam emission point on said semiconductor laser.

20. An apparatus as defined in claim 10 wherein said mode hopping detecting device comprises a first beam splitter for splitting the collimated laser beam, a second beam splitter for splitting the laser beam split by said first beam splitter into two beams, a longitudinal movement detector for receiving one of the two laser beams provided by said second beam splitter and detecting the movement of said laser beam emission point of said semiconductor laser in the longitudinal direction, an image forming lens for forming an image of the other of the laser beams provided by said second beam splitter at a predetermined position, and a two-dimensional position detector positioned at said image forming position for receiving the laser beam split by said second beam splitter and detecting the movement of said laser beam emission point in the transverse directions.

21. An apparatus as defined in claim 20 wherein said longitudinal movement detector comprises a converging lens for converging the split laser beam, an opening member provided with an opening for allowing a part of the split laser beam passing through said converging lens, and a photodetector for detecting the light amount of the split laser beam passing through said opening.

22. An apparatus as defined in claim 20 wherein said longitudinal movement detector comprises an opening member provided with an opening for allowing a part of the laser beam split by said beam splitter to pass therethrough, and a photodetector for detecting the light amount of the split laser beam passing through said opening.

23. An apparatus as defined in claim 20 wherein said longitudinal movement detector comprises a two-division circular photodetector constituted by a center section and an outer circumferential section in spaced relation to said center section and disposed so that the laser beam split by said beam splitter impinges thereupon.

24. An apparatus as defined in claim 20 wherein said mode hopping detecting device is adjusted so that a movement amount of said image forming position on said two-dimensional position detector becomes not smaller than approximately 10 times the movement amount of said laser beam emission point on said semiconductor laser.

* * * * *